United States Patent [19]
Sako

[11] Patent Number: 5,684,732
[45] Date of Patent: Nov. 4, 1997

[54] SEMICONDUCTOR DEVICES

[75] Inventor: Norimitsu Sako, Tokyo, Japan

[73] Assignee: Kawasaki Steel Corporation, Hyogo-ken, Japan

[21] Appl. No.: 619,803

[22] Filed: Mar. 20, 1996

[30] Foreign Application Priority Data

Mar. 24, 1995 [JP] Japan .................................. 7-066209
Mar. 30, 1995 [JP] Japan .................................. 7-074037

[51] Int. Cl.[6] .................................................. G11C 13/00
[52] U.S. Cl. ........................ 365/96; 365/230.01; 365/207
[58] Field of Search ........................ 365/94, 96, 189.01, 365/230.01, 207

[56] References Cited

U.S. PATENT DOCUMENTS 5,063,537  11/1991  Akrout et al. ........................ 365/96
5,243,226   9/1993  Chan .
5,302,546   4/1994  Gordon et al. .
5,313,119   5/1994  Cooke et al. .

FOREIGN PATENT DOCUMENTS 0 626 726
A2/A3  3/1994  European Pat. Off. .
A-3-225864  10/1991  Japan .
A-6-506098   7/1994  Japan .
WO 92/17001 10/1991  WIPO .
WO 93/03497  2/1993  WIPO .

OTHER PUBLICATIONS

International Application No. WO 92/01994, Feb. 1992.
International Application No. WO 93/06206, Apr. 1992.
International Application No. WO 92/17001, Oct. 1992.
International Application No. WO 93/03497, Feb. 1993.

*Primary Examiner*—Terrell W. Fears
*Attorney, Agent, or Firm*—Oliff & Berridge

[57] ABSTRACT

A semiconductor device has a constant-current circuit selectively operative in an operation mode among a writing mode in which a writing current for causing the antifuse to change in state from a breaking state to a conductive state is supplied to the antifuse, a sense mode in which a sensing current for detecting a state of the antifuse is supplied to the antifuse, and an additional writing mode in which an additional writing current for performing an additional writing is supplied to the antifuse which is subjected to writing.

12 Claims, 9 Drawing Sheets

SEMICONDUCTOR DEVICES

BACKGROUND OF THE INVENTION

1. Field of the Invention

The present invention relates to a semiconductor device capable of implementing a desired circuit operation by writing a predetermined data into a finished product or finished goods which are referred to as a so-called PLD, FPGA and the like.

2. Description of the Related Art

Recently, there have been generally used programmable semiconductor devices referred to as programmable logic devices (PLDs), field programmable gate arrays (FPGAs) and the like. Such programmable semiconductor devices are suitable particularly for the use of small quantities and multi-variety, since writing programming data after completion of products thereinto enables a desired circuit wiring to be completed so as to implement a desired circuit operation.

There are various schemes of implementing circuit wirings according to writing data in connection with such semiconductor devices. As one of such schemes, there is known a scheme in which fuses are provided in circuit wirings and a desired circuit wiring is implemented in accordance with a determination as to whether the fuse is melted to be disconnected. On the other hand, recently, there has been noticed a scheme in which a so-called antifuse is used instead of the fuse. The antifuse is an element to which an application of a voltage higher than the usual operating voltage allows the transition from the insulated state (hereinafter, referred to as "off-state") to the conductive state (hereinafter, referred to as "on-state") through the breakdown or the like. According to such antifuses, it is possible to produce elements within a semiconductor integrated circuit in an extremely small size such as the corresponding so-called via hole and the like. Thus, the antifuse has been noticed as an element which is suitable for a high integration much better than the fuse.

With respect to schemes for writing of data into the antifuse, for example, Japanese Patent Laid Open Gazette Hei.3-225864 proposes one scheme. This proposed writing scheme is a constant-voltage writing scheme in which a predetermined voltage is applied between a word wire and a bit wire provided on a PROM so that an antifuse formed on a diffusion layer of the PROM is changed in condition from the off-state to the on-state.

With respect to schemes for writing of data into the antifuse, European Patent Publication No. 0626726 also proposes one scheme. This data writing scheme is a scheme in which for each wire block provided with antifuses, a writing is carried out by applying a constant voltage to an antifuse within the block, thereafter it is determined as to whether the writing has been completed by causing a sense current to flow through the antifuse, and as a result, if it is determined that the writing has been completed, an additional writing is performed.

Further, PCT/US92/06206, U.S. Pat. No. 5,243,226, and U.S. Pat. No. 5,302,546 each disclose technology in which the constant-voltage writing scheme is adopted to precharge wire elements connected to antifuses to the intermediate potential before application of the writing voltage, and another technology in which after writing, a voltage is applied in a direction opposite to the direction of the voltage applied at the time of the writing so as to reduce the on-resistance of the antifuse which is changed in its state to be the on-state. Furthermore, Japanese Patent Laid Open Gazette Hei.6-506098, PCT/US92/01994, and U.S. Pat. No. 5,313,119 each disclose technology in which the constant-voltage writing scheme is adopted, and a high writing voltage is applied to only the antifuses to be written, while the intermediate potential is applied to the remaining antifuses.

With respect to constant-voltage writing schemes, other than the above, "Programming Antifuses in Crosspoint's FPGA" in proceedings of the IEEE 1994 CUSTOM INTEGRATED CIRCUIT CONFERENCE 9.3 introduces a constant-voltage writing scheme proposed by the several FPGA makers (Actel, Quicklogic and Crosspoint).

One of the problems of the constant-voltage writing scheme resides in the point that a constant voltage is applied to an antifuse to cause its state to be changed from the off-state to the on-state. Transition of the antifuse in state from the off-state to the on-state through a breakdown or the like causes the value of resistance of the antifuse to be reduced, so that the over-current flows for a relatively long time, for example, 1–10 msec. Consequently, the overheat of the antifuses causes a large disunity in the value of resistance of the antifuse. Further, it happens that the overheat of the antifuses causes a melting to occur whereby the antifuses returning to the off-state. For example, according to the experiment by the applicants or inventors of the present application, in case of the constant-voltage writing scheme in which a current is clamped within a range of 0.1–20 mA, the value of resistance of the antifuses varies within a range of 40Ω–1 KΩ. This causes a large delay time and a large timing skew to be brought about. Thus, it is difficult to apply the constant-voltage writing scheme to a semiconductor device such as a PROM and a PLD for use in a high speed drive.

In order to prevent a disunity in the turn-on resistance and an occurrence of the melting, it may be considered that the writing into the antifuses is implemented with a constant-current. While there is found no example in which a constant-current writing scheme is adopted for the antifuses, there is found an example, in connection with a programmable read only memory (PROM) which uses fuses as storage elements, in which a constant-current writing is performed on the fuses (cf. "NEC data book IC memory" 1989/1990, edited by NEC Corporation Semiconductor Application Technology Headquarters, issued by NEC Corporation Semiconductor Marketing Headquarters).

According to the constant-current writing scheme as mentioned above, however, there is a need to attach a complicated control circuit such that a comparison voltage is produced from a constant-voltage supply, a flow current into fuses is converted into a voltage, the resultant voltage is compared with the comparison voltage to control the current in such a manner that the flow current is clamped not to exceed a predetermined value. According to such a constant-current writing scheme, it is obliged to perform a writing one bit by one bit thereby taking a lot of time for a writing, and in addition, in view of the fact that it is a specific writing scheme, there is a need to provide a dedicated PROM writer. If it is intended that the conventional scheme of writing into the fuses of the PROM is applied to a scheme of writing into the antifuses of the semiconductor device such as a PLD and the like as it is, there is a need to attach a complicated control circuit, and in addition, it is necessary for the semiconductor device to be provided with a writing-use constant-voltage supply terminal and a constant-current supply terminal as well. The number of constant-current supply terminals to be needed corresponds to the number of parallel writings.

Even if there is adopted a scheme of performing a writing into antifuses with a constant-current, for example, such a simple scheme that a writing is performed with a predetermined time interval of constant-current pulse cannot yet avoid a large disunity in a value of the on-resistance.

SUMMARY OF THE INVENTION

In view of the foregoing, it is therefore an object of the present invention to provide a programmable semiconductor device having antifuses, which semiconductor device permits writing into the antifuses in such a manner that an on-resistance of the antifuse becomes a stably low value of resistance.

To attain the above-mentioned object, according to the present invention, there is provided a first semiconductor device comprising a first signal line and a second signal line intersecting each other, and an antifuse located at an intersection point of the first signal line and a second signal line, wherein different circuit operations are implemented according as such a writing that an electric power is supplied to the antifuse in a breaking state so that the antifuse changes in a state to a settled conductive state is carried out or not on the antifuse located at the intersection point, said semiconductor device further comprising:

a constant-current circuit for applying a voltage less than a predetermined voltage to the antifuse to supply a constant-current to the antifuse, said voltage being varied in accordance with a value of a resistance of the antifuse; and a detecting circuit for detecting whether a current starts to flow through the antifuse, wherein said constant-current circuit serves, before the lapse of a predetermined time after said detecting circuit detects the fact that the current starts to flow through the antifuse, to supply a predetermined first constant-current to the antifuse, and serves, after the lapse of the predetermined time, to stop supply of the current to the antifuse.

Further, to attain the above-mentioned object, according to the present invention, there is provided a second semiconductor device comprising a first signal line and a second signal line intersecting each other, and an antifuse located at an intersection point of the first signal line and a second signal line, wherein different circuit operations are implemented according as such a writing that an electric power is supplied to the antifuse in a breaking state so that the antifuse changes in a state to a settled conductive state is carried out or not on the antifuse located at the intersection point, said semiconductor device further comprising:

a constant-current circuit for applying a voltage less than a predetermined voltage to the antifuse to supply a constant-current to the antifuse, said voltage being varied in accordance with a value of a resistance of the antifuse; and a detecting circuit for detecting whether a current starts to flow through the antifuse, wherein said constant-current circuit serves, before the lapse of a predetermined time after said detecting circuit detects the fact that the current starts to flow through the antifuse, to supply a predetermined first constant-current to the antifuse, and serves, after the lapse of the predetermined time, to switch the predetermined first constant-current to a second constant-current smaller than the first constant-current so as to supply the second constant-current to the antifuse.

Here, in the first semiconductor device or the second semiconductor device, it is preferable that said detecting circuit is a comparator for comparing a voltage appearing on one end of the antifuse or a voltage associated with the voltage on the one end of the antifuse with a predetermined reference voltage.

Application of higher voltage than the usual operational voltage to an antifuse makes it possible to extrude a lot of metallic atoms (e.g. Al) of an electrode of the antifuse to a filament (a channel of a current formed by a breakdown), since a sectional area of the filament immediately after the breakdown of the antifuse is still small, and thus the current density is large (e.g. about $10^9$ A/cm$^2$). It is estimated that the effect is proportional to power (the second power to the third power) of the current density (this is referred to "Electro Migration", and the current is referred to an EM current). A metal of the electrodes of both ends of the antifuse is melt by the heat generation due to the EM current, so that alloys are formed. However, when the EM current flows continuously for long time, stress remains on the filament owing to the overheat. This causes a resistance value of the antifuse to scatter largely. Thus, it may happen that melting occurs and this involves the off-state again.

For these reasons, after the lapse of a predetermined time, it is switched to a constant-current (referred to an MT current) which is smaller than the EM current, or it is broken without the MT current flowing, whereby fusing for a metal of the electrodes is stably performed so that alloys are formed. On the other hand, even if a certain constant voltage is applied to the antifuse, a time from a starting point of the voltage application up to occurrence of the breakdown will be varied in accordance with antifuses.

The first semiconductor device and the second semiconductor device according to the present invention have been made in view of the foregoing. According to those semiconductor devices, the constant-current circuit serves, before the lapse of a predetermined time after the detecting circuit detects the fact that the current starts to flow through the antifuse, to supply a predetermined first constant-current to the antifuse, and serves, after the lapse of the predetermined time, to stop supply of the current to the antifuse (the first semiconductor device). Alternatively, after the lapse of the predetermined time, it is to switch the predetermined first constant-current to a second constant-current smaller than the first constant-current so as to supply the second constant-current to the antifuse (the second semiconductor device). Consequently, the first constant-current causes a lot of metallic atoms of an electrode of the antifuse to be extruded to the filament, so that a small resistance value can be obtained. Further, the stop of supply of the current or switching of the predetermined first constant-current to a second constant-current smaller than the first constant-current, after the lapse of the predetermined time, makes it possible to prevent the over-heat, whereby fusing for a metal of the electrodes is stably performed so that alloys are formed. Therefore, it is possible to obtain the small resistance value, to reduce the disunity of the resistance value, and also to prevent the off-state again.

Further, if there is used, as the detecting circuit, a comparator for comparing a voltage appearing on one end of the antifuse with a predetermined reference voltage, it is possible to simplify the circuit.

Still further, according to the first semiconductor device and the second semiconductor device of the present invention, since the constant-current circuit is simplified in a structure, it is possible to incorporate the same into the chip, whereby a load of the external circuit and writing control circuit is reduced. In a case where the constant-current circuit is incorporated into the chip, since there is no need to prepare many external terminals for writing only, it is possible to effectively use the remaining terminals. Further, it is possible to simultaneously perform writing into a plurality of antifuses, thereby reducing writing time.

To attain the above-mentioned object, according to the present invention, there is provided a third semiconductor device comprising a first signal line and a second signal line intersecting each other, and an antifuse located at an intersection point of the first signal line and a second signal line, wherein different circuit operations are implemented according as such a writing that an electric power is supplied to the antifuse in a breaking state so that the antifuse changes in a state to a settled conductive state is carried out or not on the antifuse located at the intersection point, said semiconductor device further comprising:

a constant-current circuit selectively operative in an operation mode among a writing mode in which a writing current for causing the antifuse to change in state from a breaking state to a conductive state is supplied to the antifuse, a sense mode in which a sensing current for detecting a state of the antifuse is supplied to the antifuse, and an additional writing mode in which an additional writing current for performing an additional writing is supplied to the antifuse which is subjected to writing.

According to the third semiconductor device of the present invention, the constant-current circuit is incorporated into the device, and in addition the constant-current circuit is operative selectively in the operational mode among the writing mode, the sense mode and the additional mode. These features permit the constant-current writing through supplying only a constant-voltage for writing from outside and then simply inputting address and data. Consequently, it is possible to perform the very easy writing when seeing from outside.

Further, according to the third semiconductor device of the present invention, since writing is performed with the constant-current, and in addition, there is provided the additional writing mode, and the additional writing is also performed with the constant-current, it is possible to obtain the small resistance value, to reduce the disunity of the resistance value, and also to prevent the off-state again.

Here, in the third semiconductor device of the present invention, it is preferable that said constant-current circuit has a voltage clamp circuit for limiting a voltage, which is applied to the antifuse in the breaking state, to such a level of voltage that said antifuse is kept on the breaking state.

Adoption of the voltage clamp circuit makes it possible to prevent the antifuse, which is not to be changed in the state to the turn-on state when the constant-current circuit is operative in the sense mode, from unexpectedly changing in the state to the turn-on state.

Further, in the third semiconductor device of the present invention, it is preferable that the semiconductor device further comprises a state detection circuit for detecting a state of the antifuse on the basis of a voltage which appears when the sensing current is supplied to the antifuse.

Adoption of the state detection circuit makes it possible to detect the turn-on and turn-off states of the antifuse in the sense mode, and determine as to whether the rewriting is to be implemented or the additional writing is to be implemented.

Furthermore, in the third semiconductor device of the present invention, it is preferable that said first signal line comprises a plurality of first signal lines mutually extending in parallel, and said second signal line comprises a plurality of second signal lines mutually extending in parallel, and said antifuse is arranged at each of intersection points of the plurality of first signal lines and the plurality of second signal lines, said semiconductor device further comprising:

first switching circuits each connected in series to an associated one of said plurality of first signal lines;

second switching circuits each connected in series to an associated one of said plurality of second signal lines;

a first decoder for optionally selecting desired ones of said plurality of first signal lines through control of said first switching circuits; and a second decoder for optionally selecting desired ones of said plurality of second signal lines through control of said second switching circuits, wherein said constant-current circuit supplies constant-currents, which are controlled independently of each other on a parallel basis, are supplied to one or a plurality of antifuses which are simultaneously selected for writing in accordance with said first decoder and said second decoder in their combination.

In the third semiconductor device of the present invention, the feature such that "said constant-current circuit supplies constant-currents, which are controlled independently of each other on a parallel basis, are supplied to one or a plurality of antifuses which are simultaneously selected for writing in accordance with said first decoder and said second decoder in their combination" makes it possible to perform the high speed writing.

Further, in the third semiconductor device of the present invention, it is preferable that said first decoder and said second decoder have modes for simultaneously selecting all of the first signal lines and all of the second signal lines selected by said first decoder and said second decoder, respectively.

In writing, when a voltage for supplying a writing current is applied, if a potential on a signal line to which said voltage is applied is different from a potential on a signal line involved in the antifuse, which is not intended to perform writing in conjunction with the former signal line, a voltage is instantaneously applied to the antifuse, and thus there is a fear such that the antifuse, which is not intended to perform writing, is inadvertently changed in the state to the turn-on state. For this reason, it is preferable that prior to writing, all of the first signal lines and all of the second signal lines are precharged beforehand to the potential, for example, one half of the writing voltage. In this case, if said first decoder and said second decoder have modes for simultaneously selecting all of the first signal lines and all of the second signal lines selected by said first decoder and said second decoder, respectively, then it is possible, prior to writing, to simultaneously precharge all of the first signal lines and all of the second signal lines, thereby reducing the set up time for the writing operation.

Furthermore, in the third semiconductor device of the present invention, it is preferable that said constant-current circuit has:

a reference current generating circuit for generating a reference current; and a constant-current supplying circuit for generating by the use of a current mirror circuit a constant-current according to the reference current generated from said reference current generating circuit, and supplying the constant-current thus generated to the antifuse.

As mentioned above, if the constant-current circuit is constituted of the reference current generating circuit and the constant-current supplying circuit for generating by the use of a current mirror circuit a constant-current according to the reference current generated from said reference current generating circuit and supplying the constant-current thus generated to the antifuse, it is sufficient to generate a reference current once. Thereafter, the use of the current mirror circuit having a simple structure permits an easy copy of the reference current by the corresponding parallel writing number. Thus, it is possible to simultaneously supply to a plurality of antifuses constant-currents which are controlled independently of each other.

It is possible to combine the first semiconductor device according to the present invention with the third semiconductor device according to the present invention. In connection with the semiconductor device according to the present invention in their combination, in the third semiconductor device according to the present invention, said semiconductor device further comprises a detecting circuit for detecting whether a current starts to flow through the antifuse in the writing mode, and wherein said constant-current circuit serves, in the writing mode, before the lapse of a predetermined time after said detecting circuit detects the fact that the current starts to flow through the antifuse, to supply a predetermined first constant-current to the antifuse, and serves, after the lapse of the predetermined time, to stop supply of the current to the antifuse. According to the invention as described above, it is possible to more stably change the antifuse in the state to the turn-on state of the low resistance.

It is possible to combine the second semiconductor device according to the present invention with the third semiconductor device according to the present invention. In connection with the semiconductor device according to the present invention in their combination, in the third semiconductor device according to the present invention, said semiconductor device further comprises a detecting circuit for detecting whether a current starts to flow through the antifuse in the writing mode, and wherein said constant-current circuit serves, in the writing mode, before the lapse of a predetermined time after said detecting circuit detects the fact that the current starts to flow through the antifuse, to supply a predetermined first constant-current to the antifuse, and serves, after the lapse of the predetermined time, to switch the predetermined first constant-current to a second constant-current smaller than the first constant-current so as to supply the second constant-current to the antifuse. Also in this case, it is possible to more stably change the antifuse in the state to the turn-on state of the low resistance.

DESCRIPTION OF THE PREFERRED EMBODIMENTS

Hereinafter, there will be described embodiments of the present invention.

Figure 1:
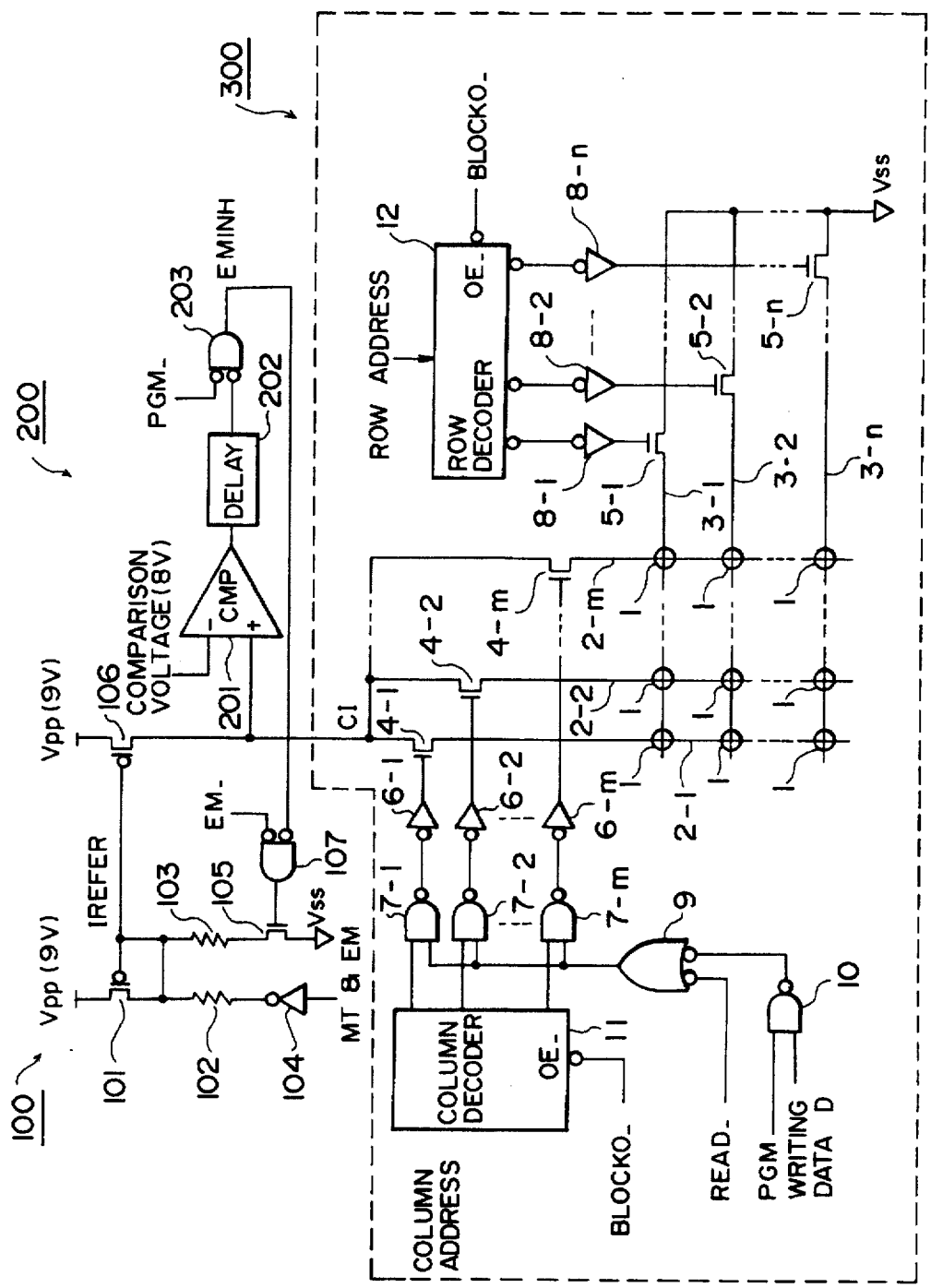
FIG. 1 is a circuit diagram of an antifuse writing circuit of a PLD which incorporates thereinto a semiconductor device according to the first embodiment of the present invention.

FIG. 1 is a circuit diagram of an antifuse writing circuit of a PLD which incorporates thereinto a semiconductor device according to the first embodiment of the present invention.

FIG. 1 shows an antifuse writing circuit comprises a constant-current circuit 100 for supplying a constant-current to antifuses 1, a detection circuit 200 for detecting whether or not a current starts to flow through the antifuses 1, and a block 300 in which a plurality of antifuses 1 are arranged and in addition circuits for optionally selecting the antifuses 1 are disposed.

The antifuses 1 of the block 300 are disposed at the crossing or intersection points of a plurality of first signal lines 2_1, 2_2, ..., 2_m, which extend in a vertical direction, and a plurality of second signal lines 3_1, 3_2, ..., 3_n, which extend in a horizontal direction. Connected to the first signal lines 2_1, 2_2, ..., 2_m and the second signal lines 3_1, 3_2, ..., 3_n are inputs and outputs of a plurality of circuits (not illustrated). These circuits will be each connected by wires which are different according as the associated antifuse 1 is kept on the off-state or is changed to the on-state. As a result, there will be implemented a resultant circuit which is different as a whole in accordance with writing data into the antifuses 1.

In the block 300, the first signal lines 2_1, 2_2, ..., 2_m are connected to first ends of the NMOS transistors 4_1, 4_2, ..., 4_m, respectively. Second ends of the NMOS transistors 4_1, 4_2, ..., 4_m are connected to each other on a common basis, further connected to a non inverting input of a comparator 201, and connected via a PMOS transistor 106 to a writing power supply $V_{PP}$ (9V). The gates of the NMOS transistors 4_1, 4_2, ..., 4_m are connected via voltage transformation type of inverters 6_1, 6_2, ..., 6_m, which will be described later, to the outputs of the NAND gates 7_1, 7_2, ..., 7_m, respectively.

First inputs of the NAND gates 7_1, 7_2, ..., 7_m are connected to the associated outputs of a column decoder 11, respectively. Inputted to the column decoder 11 are a column address for optionally selecting the first signal lines 2_1, 2_2, ..., 2_m and a signal BLOCK0_ for enabling the column decoder 11.

Second inputs of the NAND gates 7_1, 7_2, ..., 7_m are connected to an output of a NAND gate 9 on a common connection basis. One input of the NAND gate 9 is connected to an output of a NAND gate 10. Another input of the NAND gate 9 is adapted to receive a read signal READ_ for checking as to whether or not the respective antifuses 1 are properly in the off-state or the on-state after the completion of writing into the antifuses 1. Incidentally, there are not illustrated circuits (e.g. sense amplifiers and the like) for reading out. One of inputs of the NAND gate 10 is adapted to receive a program pulse signal PGM for performing writing into the antifuses 1. Another input of the NAND gate 10 is adapted to receive a writing data signal D for determining whether or not writing into the antifuses 1 is performed.

The second signal lines 3_1, 3_2, ..., 3_n are connected to first ends of the NMOS transistors 5_1, 5_2, ..., 5_n, respectively. Second ends of the NMOS transistors 5_1, 5_2, ..., 5_n are connected to the ground $V_{SS}$ on a common basis. The gates of the NMOS transistors 5_1, 5_2, ..., 5_n are connected via voltage transformation type of inverters 8_1, 8_2, ..., 8_n to outputs of a row decoder 12, respectively.

Inputted to the row decoder 12 are a row address for optionally selecting the second signal lines 3_1, 3_2, ..., 3_n and the signal BLOCKO_ for enabling the row decoder 12.

One end of a PMOS transistor 101 of the constant-current circuit 100 is connected to the writing power supply $V_{PP}$ (9V). Another end of the PMOS transistor 101 is connected to a gate of the PMOS transistor 101, a gate of the PMOS transistor 106, and first ends of the resistances 102 and 103. Another end of the resistance 102 is connected to an output of a voltage transformation type of inverter 104 to which a signal MT&EM, which is held in an "H" level during writing into the antifuses 1, is fed. On the other hand, another end of the resistance 103 is connected to the ground $V_{SS}$ through an NMOS transistor 105. A gate of the NMOS transistor 105 is connected to an output of a NOR gate 107.

An inverting input of the comparator 201 of the detection circuit 200 receives a comparison voltage (8V) to be compared with a voltage of a node CI associated with a voltage of one ends of the antifuses 1. An output of the comparator 201 is connected to one input of a NOR gate 203 via a delay circuit 202. Another input of the NOR gate 203 receives an inverted program pulse signal PGM_ of the above-mentioned program pulse signal PGM. An output of the NOR gate 203 is connected to one input of the NOR gate 107. Another input of the NOR gate 107 is adapted to receive a signal EM_ which is held in a "L" level during writing into the antifuses 1.

Figure 2A:
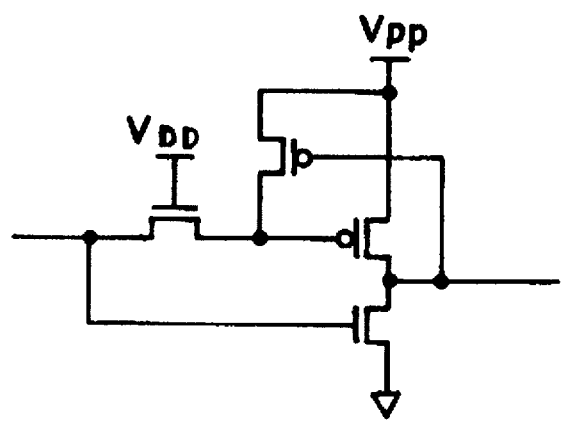
FIGS. 2(A) and 2(B) are each a circuit diagram of a voltage transformation type of inverter by way of example.
Figure 2B:
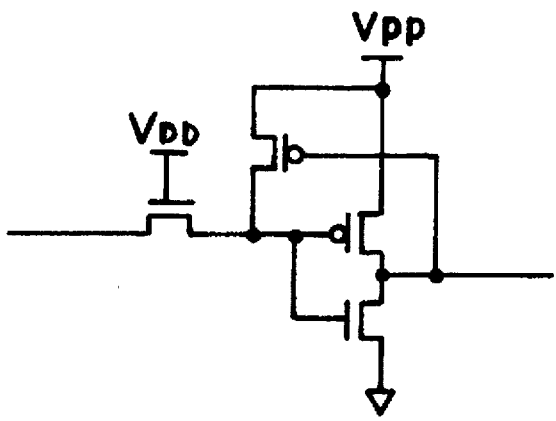

FIGS. 2(A) and 2(B) are each a circuit diagram of a voltage transformation type of inverter by way of example.

In these inverters, when an input of the inverter changes in level of an operational voltage $V_{DD}$ (e.g. 3.3V) of the circuit shown in FIG. 1 from the "H" level to the "L" level, an output of the inverter changes in level of a writing voltage $V_{PP}$ (e.g. 9V) from the "L" level to the "HH" level, and reversely, when changing from the "L" level to the "H" level, changing from the "HH" level to the "L" level. Incidentally, here, while there are shown two examples of the inverter circuit, it is noted that the voltage transformation type of inverter is not restricted by these examples.

Figure 3:
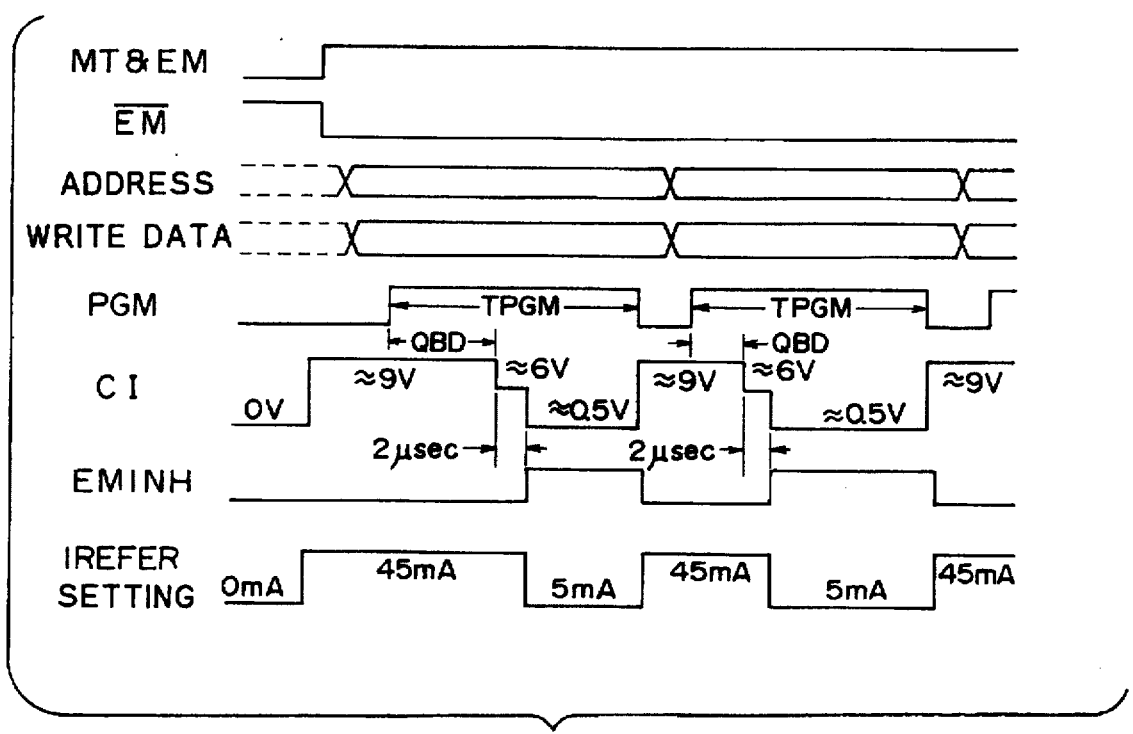
FIG. 3 is a time chart useful for understanding an operation of the antifuse writing circuit.

FIG. 3 is a time chart useful for understanding an operation of the antifuse writing circuit.

While the time chart does not show a read signal READ_, it is assumed that the read signal READ_is set up to the "H" level when writing into the antifuses 1 is performed.

First, the voltage transformation type of inverter 104 shown in FIG. 1 receives the signal MT&EM having the level, and the NOR gate 107 receives the signal EM_ having the "L" level. While the program pulse signal PGM is outputted in the "L" level, the NAND gates 7_1, 7_2, ..., 7_m each receive the "L" level of signal via the NAND gate 10 and the NAND gate 9. Hence, at that time, a designation of the antifuses 1 is not carried out. Since the NOR gate 203 receives the program pulse signal PGM_ having the "H" level, the NOR gate 203 outputs a signal EMINH having the "L" level. The signal EMINH having the "L" level is fed to the NOR gate 107. Since the NOR gate 107 has received the signal EM_ having the "L" level, the NOR gate 107 outputs a signal having the "H" level whereby the NMOS transistor 105 turns on.

Thus, a current (hereinafter referred to as MT current) flows into the voltage transformation type of inverter 104 through the writing power supply $V_{PP}$, the PMOS transistor 101 and the resistance 102 in the named order. Further, a current flows into the ground $V_{SS}$ through the writing power supply $V_{PP}$, the PMOS transistor 101, the resistance 103 and the NMOS transistor 105 in the named order. The current, which flows through the PMOS transistor 101, is referred to as an EM current. At that time, while the PMOS transistor 106 also intends to conduct a current, the current does not flow through the PMOS transistor 106, because a designation of the antifuses 1 is not yet carried out and thus a current does not flow through the antifuses 1. Consequently, the potential of the node CI as the constant-current supply shown in FIG. 1 is the power supply voltage $V_{PP}$ (9V). The potential (9V) of the node CI is compared with the comparison voltage (8V) in the comparator 201. As a result, the comparator 201 outputs a signal having the "H" level, which signal is passed via the delay circuit 202 to the NOR gate 203. Since the NOR gate 203 has received the program pulse signal PGM_ having the "H" level, the NOR gate 203 outputs the EMINH having the "L" level.

Next, the column decoder 11 and the row decoder 12 receive the column address and the row address, respectively. These decoders 11 and 12 further receive the enable signal BLOCKO_ having the "L" level. In case of writing into the antifuses 1 designated by the column address and the row address, the writing data D takes the "H" level. Even if any antifuse 1 is designated by the column address and the row address, the writing data D is kept on the "L" level when writing into the antifuse 1 is not effected. Hereinafter, the explanation will be continued assuming that writing is effected on the designated antifuse 1. When the program pulse signal PGM changes in level to the "H" level, the column decoder 11 outputs, at any associated output thereof according to the entered column address, the "H" level of signal, since the enable signal BLOCKO_takes the "L" level. On the other hand, since both the program pulse signal PGM and the writing data D take the "H" level, a signal having the "H" level appears on the output of the NAND gate 9 via the NAND gate 10. Thus, any one of the NAND gates 7_1, 7_2, ..., 7_m outputs a signal having the "L" level, which signal is passed via the associated one of the voltage transformation type of inverters 6_1, 6_2, ..., 6_m to the associated one of the NMOS transistors 4_1, 4_2, ..., 4_m, so that the associated NMOS transistor turns on.

On the other hand, the row decoder 12 outputs, at any associated output thereof according to the entered row address, the "L" level of signal, since the enable signal BLOCKO_takes the "L" level. Thus, the associated one of the NMOS transistors 5_1, 5_2, ..., 5_n turns on via the associated one of the voltage transformation type of inverters 8_1, 8_2, ..., 8_n. In this manner, designated is the antifuse 1 located at the intersection point of the first signal lines 2_1, 2_2, ..., 2_m and the second signal lines 3_1, 3_2, ..., 3_n. Incidentally, as noted above, if it is desired that the designated antifuse 1 is retained on the turn-off state, the writing data D is given with the "L" level.

The PMOS transistor 101 and the PMOS transistor 106 constitutes a current mirror circuit. The gates of the PMOS transistors 101 and 106 are connected to each other. When the EM current (45 mA) flows through the PMOS transistor 101, the PMOS transistor 106 serves to supply the EM current (45 mA) to the antifuses 1. On the other hand, when the MT current (5 mA) flows through the PMOS transistor 101, the PMOS transistor 106 serves to supply the MT current (5 mA) to the antifuses 1.

The potential of the node CI is compared with the comparison voltage in the comparator 201. In the initial state in which the EM current is intended to flow into the designated antifuse 1, the resistance value of the antifuse 1 is still large and thus no current flows through the antifuse 1. Consequently, the potential of the node CI is larger than the comparison voltage. As a result, even if the program pulse signal PGM__, which has been fed to the NOR gate 203, is of the "L" level, the signal EMINH is of the L" level, since the comparator 201 still outputs an "H" level of signal, which is passed via the delay circuit 202 to the NOR gate 203. Thus, there is applied to the antifuse 1 a voltage which serves to cause the current (45 mA) corresponding to the EM current to flow through the antifuse 1.

Next, it is assumed that after the lapse of a time QBD shown in FIG. 3, a breakdown occurs on the antifuse 1. At the time when the breakdown occurs, the resistance value of the antifuse 1 becomes rapidly small, so that a large current (about 45 mA) flows through the antifuse 1. As a result, the potential of the node CI goes down under 6V. Thus, the comparator 201 outputs an "L" level of signal.

The "L" level of signal is fed to the delay circuit 202 to be delayed by 2µ sec. The delayed signal is fed to the NOR gate 203. Since the NOR gate 203 has received the program pulse signal PGM__ having the "L" level, the NOR gate 203 outputs the signal EMINH having the "H" level, which signal is passed via the NOR gate 107 to the NMOS transistor 105 to be turned off. As a result, the MT current (5 mA) flows through the antifuse 1. Thus, the potential of the node CI goes down under 0.5 V, so that the comparator 201 outputs in succession the "L" level of signal. In this manner, the EM current flows by a predetermined time (2µ sec.) after the breakdown occurs, and thereafter a switching is performed from the EM current (45 mA) to the MT current (5 mA) which is less than the EM current. Thus, it is possible to obtain a filament having a stable small resistance value, thereby preventing disunity in resistance value and off-state again due to the overheat.

Next, after the lapse of a TPGM time since the program pulse signal PGM changed in level to the "H" level, when the program pulse signal PGM changes in level to the "L" level, the NAND gate 10 receives the "L" level of signal and thus outputs an "H" level of signal. As a result, the NAND gate 9 outputs an "L" level of signal, so that the designation of the antifuse 1 is released to break a current to the antifuse 1. Thus, the potential of the node CI goes up to about 9 V. The NOR gate 203 receives the "H" level of program pulse signal PGM__ and thus outputs the "L" level of signal EMINH, which is passed via the NOR gate 107 to the NMOS transistor 105. As a result, the NMOS transistor 105 turns on, so that the EM current flows through the PMOS transistor 101.

Further after the lapse of a predetermined time, the column address, the row address and the writing data D are entered, and in addition the "H" level of program pulse signal PGM is entered. Then the above-mentioned operation is repeatedly carried out. Here, it is noted that as shown in FIG. 3, even if the respective antifuses 1 are different in the breakdown time from each other, writing into the antifuses 1 is performed in compliance with the different breakdown time, thereby obtaining filaments each having uniformly stable resistance value.

Incidentally, according to the present embodiment, the constant-current circuit 100 and the detection circuit 200, which correspond to the writing circuit referred to in the present invention, are mounted together with the block 300 on one chip. While it is preferable that those elements are mounted on one chip, the writing circuit referred to in the present invention is not restricted to one mounted on the chip. It is acceptable to adopt one which is adapted to attach when writing.

Figure 4:
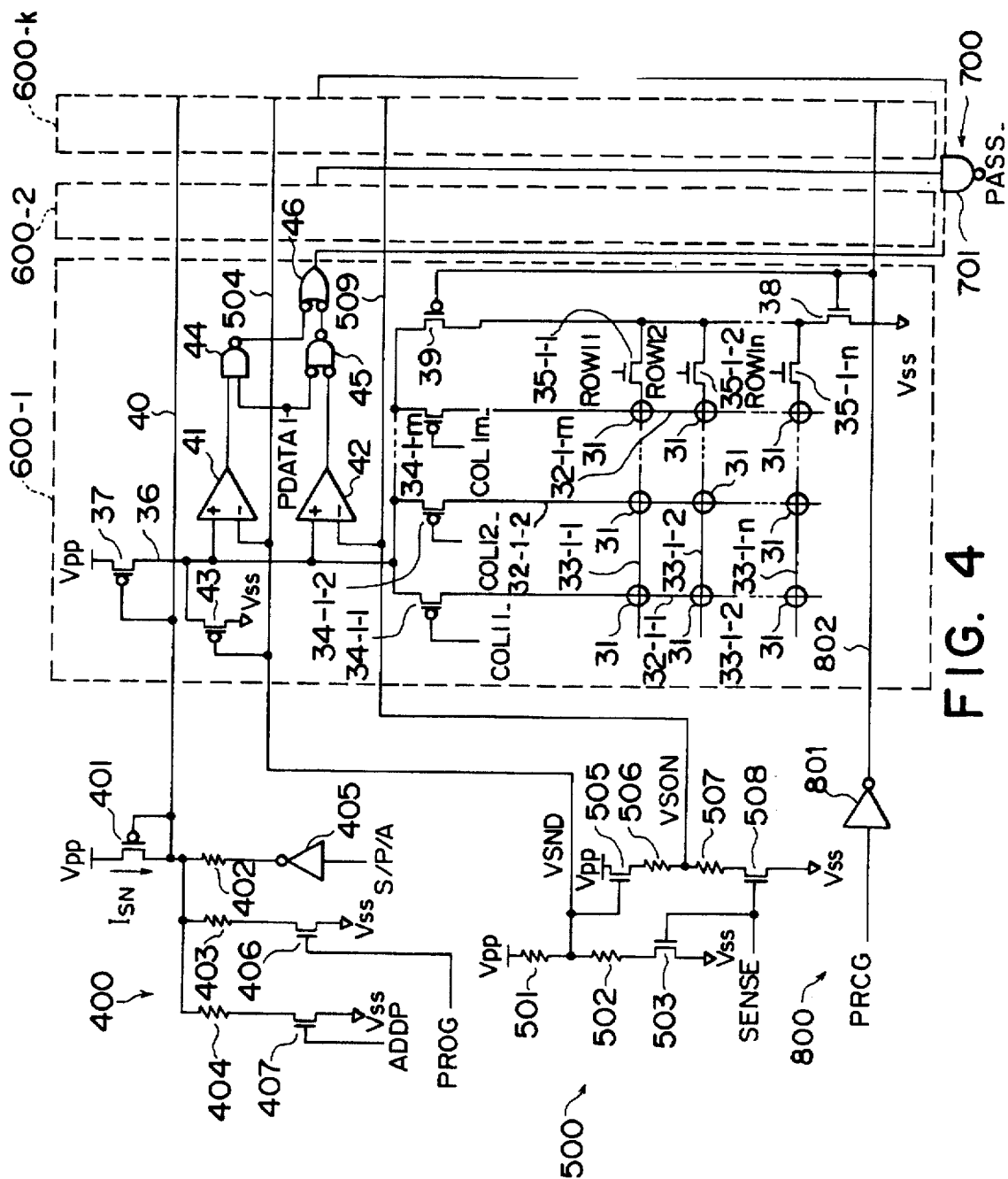
FIG. 4 is a circuit diagram of a writing circuit portion into antifuses of a semiconductor device according to the second embodiment of the present invention.

FIG. 4 is a circuit diagram of a writing circuit portion into antifuses of a semiconductor device according to the second embodiment of the present invention;

The writing circuit portion shown in FIG. 4 comprises: a reference current generating circuit 400 for generating reference currents according to a writing mode, a sense mode and a additional writing mode; a comparison voltage generating circuit 500 for generating a comparison voltage at the time of the sense mode; a plurality of blocks 600__1, 600__2, ..., 600__k in each of which a plurality of antifuses are arranged; a determination gate circuit 700 for outputting a determination result as to whether the proper writing is carried out at the time of the sense mode; and a precharge control circuit 800 for transmitting a control signal when a precharge is performed.

Here, it is noted that the writing mode implies a mode in which a writing current flows through antifuses 31 in the off state to cause a transition of the antifuses 31 into the on state; the sense mode implies a mode in which a sense current flows through the antifuses 31 to sense whether a proper writing into the antifuses 31 has been carried out; and the additional writing mode implies a mode in which an additional current flows through the antifuses 31, which has been subjected to the transition into the on state, to ensure the on state of the antifuses 31.

Incidentally, it may happen that the term "writing" is used as the general term for a series of operation of writing in combination of the writing mode, the sense mode and the additional writing mode.

Circuits of the blocks 600__1, 600__2, ..., 600__k are the same as each other. Hence, only the block 600__1 is illustrated, and will be explained hereinafter.

The antifuses 31 of the block 600 are disposed at the crossing or intersection points of a plurality of first signal lines 32__1__1, 32__1__2, ..., 32__1__m, which extend in a vertical direction, and a plurality of second signal lines 33__1__1, 33__1__2, ..., 33__1__n, which extend in a horizontal direction. Connected to the first signal lines 32__1__1, 32__1__2, ..., 32__1__m and the second signal lines 33__1__1, 33__1__2, ..., 33__1__n are inputs and outputs of a plurality of circuits (not illustrated). These circuits will be each connected by wires which are different according as the associated antifuse 31 is kept on the off-state or is changed to the on-state. As a result, there will be implemented a resultant circuit which is different as a whole in accordance with writing data into the antifuses 31.

In the block 600__1, the first signal lines 32__1__1, 32__1__2, ..., 32__1__m, are connected to one ends of PMOS transistors 34__1__1, 34__1__2, ..., 34__1__m, respectively. Another ends of the PMOS transistors 34__1__1, 34__1__2, ..., 34__1__m are connected to each other on a common basis, and connected via a constant-current supply line 36 and a PMOS transistor 37 to a writing power supply $V_{PP}$. The gates of the PMOS transistors 34__11, 34__1__2, ..., 34_1_m are connected to a column decoder (cf. FIG. 5(A)) which will be described later. The gate of the PMOS transistor 37 is connected to a constant-current level transmission line 40 extending from the reference current generating circuit 400 crossing the blocks 600_1, 600_2, ..., 600_k.

The second signal lines 33_1_1, 31_2_, ..., 33_1_n are connected to one ends of NMOS transistors 35_1_1, 35_1_2, ..., 35_1_n, respectively. Another ends of the NMOS transistors 35_1_1, 35_1_2, ..., 35_1_n are connected via the NMOS transistor 38 to the ground $V_{SS}$ on a common basis, and further connected via the PMOS transistor 39 to the constant-current supply line 36. The gates of the NMOS transistors 35_1_1, 35_1_2, ..., 35_1_n are connected to a row decoder (cf. FIG. 5(B)) which will be described later. The gates of the NMOS transistor 38 and the PMOS transistor 39 are connected to a first precharge control line 802 extending from an output of a voltage transformation type of inverter 801 of the precharge control circuit 800 crossing the blocks 600_1, 600_2, ..., 600_k. The voltage transformation type of inverter 801 receives a precharge control signal PRCG.

In the comparison voltage generating circuit 500, a resistor 501, a resistor 502 and an NMOS transistor 503 are connected in series between the writing power supply $V_{PP}$ and the ground $V_{SS}$. The NMOS transistor 503 is controlled in its turn on and off in accordance with the sense signal SENSE.

A first comparison signal line 504 extends from the connecting point of the resistors 501 and 502 crossing the blocks 600_1, 600_2, ..., 600_k. A first comparison voltage VSND is transferred on the first comparison signal line 504 when the sense signal SENSE is of the "H" level. Here, the resistor 501 and the resistor 502 are the same as each other in their resistance value. Consequently, the first comparison voltage VSND is approximately $V_{PP}/2$. The NMOS transistor 503 is provided for the purpose of preventing unnecessary power consumption, and is operative to turn on in the sense mode.

Further, in the comparison voltage generating circuit 500, an NMOS transistor 505, a resistor 506, a resistor 507 and an NMOS transistor 508 are connected in series between the writing power supply $V_{PP}$ and the ground $V_{SS}$. A gate of the NMOS transistor 505 is connected to the first comparison signal line 504. The NMOS transistor 508 is controlled in its turn on and off in accordance with the sense signal SENSE.

A second comparison signal line 509 extends from the connecting point of the resisters 506 and 507 crossing the blocks 600_1, 600_2, ..., 600_k. A second comparison voltage VSON is transferred on the second comparison signal line 509 when the sense signal SENSE is of the "H" level. The second comparison voltage VSON is set up to a voltage higher than that appearing on the constant-current supply line 36 when the sense current flows through the antifuse 31 after transition into the turn-on state, that is, VSON>(ON-resistance of the antifuse 31)×sense current Here, the NMOS transistor 505 is of a source follower, and the second comparison voltage VSON is defined by a voltage which will be derived when a voltage, which is lower by a threshold voltage $V_{TN}$ of the NMOS transistor than the first comparison voltage VSND, is resistance-divided by the resistor 506 (resistance value $R_{506}$) and the resistor 507 (resistance value $R_{507}$), that is,

VSON=(VSND−$V_{TN}$)·$R_{507}$/($R_{506}$+$R_{507}$)

The NMOS transistor 508 is provided for the purpose of preventing unnecessary power consumption, and is operative to turn on in the sense mode which needs the comparison voltage.

In the reference current generating circuit 400, there is provided a PMOS transistor 401. A gate of the PMOS transistor 401 is connected to a constant-current level transmission line 40. Hence, the PMOS transistor 401 and the PMOS transistor 37 of the block 600_1 constitutes a current mirror circuit. When a reference current $I_{SN}$ flows through the PMOS transistor 401, the constant-current corresponding to the reference current $I_{SN}$ is supplied to the antifuse 31 side via the PMOS transistor 37 of the block 600_1.

Connected to the PMOS transistor 401 are three resistors 402, 403 and 404. Another end of the resistor 402 is connected to an output of a voltage transformation type of inverter 405. Another ends of the resistors 403 and 404 are connected to the ground $V_{SS}$ via NMOS transistors 406 and 407, respectively.

As the resistors 402, 403 and 404, and the resistors 501, 502, 506 and 507 in the comparison voltage generating circuit 500, a polysilicon resistance, a well resistance, a diffusion resistance and FET resistance may be used.

The voltage transformation type of inverter 405 receives in anyone of the writing mode, the sense mode and the additional writing mode an "H" level of pulse signal S/P/A. In a mode other than those modes, that is, the usual operation mode in which writing into the antifuses 31 is terminated and the semiconductor device performs a predetermined circuit operation, an input of the voltage transformation type of inverter 405 is kept on an "L" level.

A gate of the NMOS transistor 406 receives a program signal PROG. The program signal PROG is a pulse signal which takes an "H" level while the writing into the antifuse 31 is being performed and also while the additional writing bring performed.

A gate of the NMOS transistor 407 receives an additional writing signal ADDP. The additional writing signal ADDP is a pulse signal which takes an "H" level only while the additional writing into the antifuse 31 is being performed.

In this manner, in the sense mode, the "H" level of signal S/P/A appears, so that the reference current $I_{SN}$, for example, 3 mA, flows through the PMOS transistor 401; in the writing mode, both the pulse signal S/P/A and the program signal PROG appear in the form of the "H" level, so that the reference current $I_{SN}$, for example, 10 mA, flows through the PMOS transistor 401; and in the additional writing mode, the signal S/P/A, the program signal PROG and in addition the additional writing signal ADDP appear in the form of the "H" level, so that the reference current $I_{SN}$, for example, 20 mA, flows through the PMOS transistor 401.

In the sense mode, the voltage transformation type of inverter 405 receives the pulse signal S/P/A, while the gates of the NMOS transistors 503 and 508 of the comparison voltage generating circuit 500 receive the sense signal SENSE. Thus, the reference current for sensing flows through the reference current generating circuit 400, so that the sense current flows through the constant-current supply line 36 via the PMOS transistor 37. The comparison voltage generating circuit 500 generates two comparison voltages VSND and VSON, which are passed to the comparators 41 and 42, respectively. A PMOS transistor 43 for voltage clamping is disposed between the constant-current supply line 36 and the ground $V_{SS}$. A gate of the PMOS transistor 43 receives the comparison voltage VSND. Consequently, in the sense mode, the maximum voltage applied to the antifuses 31 via the constant-current supply line 36 is clamped, when the threshold voltage of the PMOS transistor 43 is expressed by $V_{TP}$, to VSND+$V_{TP}$. This voltage is set up to such a voltage level that even if this voltage is applied to the antifuse 31 in the turn-off state, the antifuse 31 in the turn-off state does not change in the state to the turn-on state. This is a measure for preventing the antifuse 31 in the turn-off state from unexpectedly changing in state to the turn-on state in the sense mode in which it is determined whether the antifuse 31 is in the turn-on state or the turn-off state. When the sense current is supplied to the antifuse 31 in the turn-on state, the voltage appearing on the constant-current supply line 36 will be remarkably lower voltage than the clamp voltage.

Another terminals of the comparators 41 and 42, which are different from the one terminals to which the comparison voltages VSND and VSON are respectively applied, are connected to the constant-current supply line 36.

An output of the comparator 41 is fed to a NAND gate 44, and an output of the comparator 42 is fed to a OR gate 45. The NAND gate 44 and the OR gate 45 receive an expected value PDATA ("L" level in the turn-on state) in the turn-on state and turn-off state of the antifuse 31 now sensed. An output of the NAND gate 44 and an output of the OR gate 45 are fed to a NAND gate 46. An output of the NAND gate 46 is fed to a NAND gate 701 of a determination gate circuit 700. In a similar fashion, with respect to the respective NAND gates 46 on the whole blocks 600_1, 600_2, ..., 600_k, outputs of those NAND gates 46 are fed to the NAND gate 701 of the determination gate circuit 700.

In a case where the antifuse 31 of interest, to which the sense current is intended to be supplied, is in the turn-off state, the potential of the constant-current supply line 36 becomes the clamp voltage and then it is higher than the comparison voltage VSND. Hence, the output of the comparator 41 takes an "H" level. When it matches with the expected value PDATA, the NAND gate 44 outputs an "L" level of signal, and thus the NAND gate 46 outputs an "H" level of signal.

On the other hand, when the antifuse 31, to which the sense current is supplied, is in the turn-on state, the potential of the constant-current supply line 36 becomes a voltage which is lower than the comparison voltage VSON. Hence, the output of the comparator 42 takes an "L" level. When it matches with the expected value PDATA, the OR gate 45 outputs an "L" level of signal, and the NAND gate 46 outputs an "H" level of signal.

When the sense current flows through the antifuse 31, if the potential of the constant-current supply line 36 is lower than the comparison voltage VSND and is higher than the comparison voltage VSON, the NAND gate 46 outputs an "L" level of signal.

When the NAND gate 46 outputs an "H" level of signal, it indicates that the turn-on or turn-off state of the antifuse 31 now sensed in the block 600_1 is normal. On the other hand, when the NAND gate 46 outputs an "L" level of signal, it indicates that the antifuse 31 is of failure or is incomplete in writing.

With respect to the respective NAND gates 46 on the whole blocks 600_1, 600_2, ..., 600_k, if those NAND gates 46 output "H" level of signals, the NAND gate 701 outputs an "L" level of output signal PASS_ which indicates that all of the antifuses of each of the blocks 600_1, 600_2, ..., 600_k are normal.

Figures 5A, 5B:
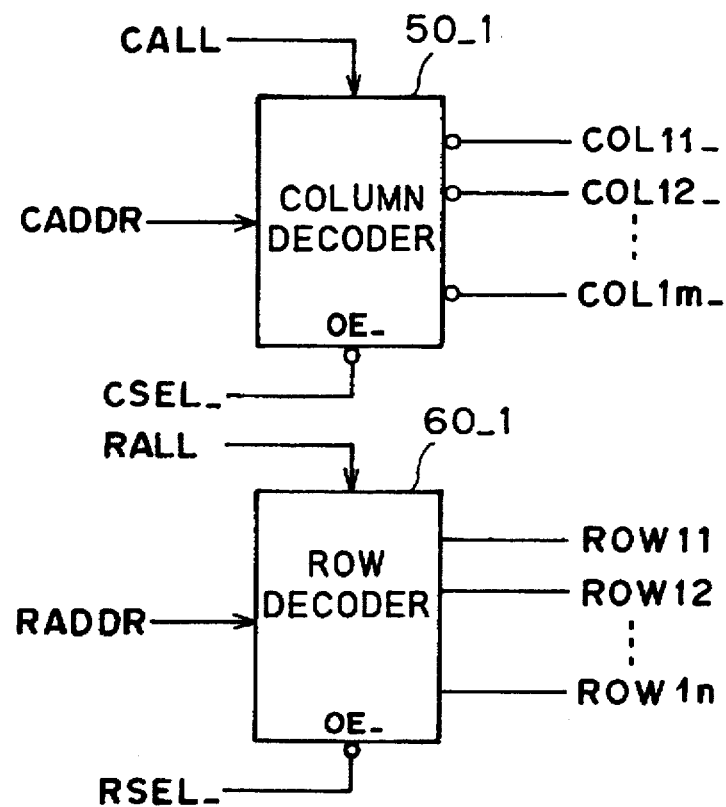
FIGS. 5(A) and 5(B) are diagrams showing input and output signals of a column decoder and a row decoder, respectively.

FIGS. 5(A) and 5(B) are diagrams showing input and output signals of a column decoder and a row decoder, respectively.

The column decoder 50_1 and the row decoder 60_1 shown in FIGS. 5(A) and 5(B) correspond to the block 600_1 shown in FIG. 4. The same column decoder and the row decoder as the column decoder 50_1 and the row decoder 60_1 are provided for each of the blocks 600_1, 600_2, ..., 600_k shown in FIG. 4.

Regarding the column decoder 50_1, when an enable signal CSEL_ appears with an "H" level, all output signals COL11_, COL12_, ..., COL1m_ appear with an "H" level, so that all the PMOS transistors 34_1_1, 34_1_2, ..., 34_1_m, as shown in FIG. 4, turn off. When the enable signal CSEL_ appears with an "L" level and a signal CALL appears with an "L" level, anyone of the output signals COL11_, COL12_, ..., COL1m_appears with an "L" level in accordance with the entered column address CADDR, so that anyone of the PMOS transistors 34_1_1, 34_1_2, ..., 34_1_m, as shown in FIG. 4, turns on. When the enable signal CSEL_ appears with an "L" level and the signal CALL appears with an "H" level, all of the output signals COL11_, COL12_, ..., COL1m_ appears with an "L" level, so that all the PMOS transistors 34_1_1, 34_1_2, ..., 34_1_m, as shown in FIG. 4, turn on.

Regarding the row decoder 60_1, when an enable signal RSEL_ appears with an "H" level, all output signals ROW11_, ROW12_, ..., ROW1n_ appear with an "L" level, so that all the NMOS transistors 35_1_1, 35_1_2, ..., 35_1_n, as shown in FIG. 4, turn off. When the enable signal RSEL_ appears with an "L" level and a signal RALL appears with an "L" level, anyone of the output signals ROW11_, ROW12_, ..., ROW1m_ appears with an "H" level in accordance with the entered row address RADDR, so that anyone of the NMOS transistors 35_1_1, 35_1_2, ..., 35_1_n, as shown in FIG. 4, turns on. When the enable signal RSEL_ appears with an "L" level and the signal RALL appears with an "H" level, all of the output signals ROW11_, ROW12_, ..., ROW1n_ appears with an "H" level, so that all the RMOS transistors 35_1_1, 35_1_2, ..., 35_1_n, as shown in FIG. 4, turn on.

When writing of the antifuses 31 is performed, first, prior to writing, the CALL signal and the RALL signal are given with "H" level; all of the PMOS transistors 34_1_1, 34_1_2, ..., 34_1_m, as shown in FIG. 4, and all the NMOS transistors 35_1_1, 35_1_2, ..., 35_1_n, as shown in FIG. 4, are turned on; and the PRCG signal is given with the "H" level. Thereafter, the S/P/A signal and the SENSE signal are given with an "H" level. Thus, the current, which is the same as the sense current in the level, flows through all the plurality of first signal lines 32_1_1, 32_1_2, ..., 32_1_m, and all the plurality of second signal lines 33_1_1, 33_1_2, ..., 33_1_n, so that all those first and second signal lines are precharged to the same voltage, that is, VSND+$V_{TP}$. After the termination of the precharge, the CSEL_ signal and the RSEL_ signal are given with an "H" level, and the PRCG signal returns in level to an "L" level. Then, writing of the antifuses 31 is performed.

The precharge on the first and second signal lines prior to the writing, as mentioned above, inhibits the over voltage from being applied to other than the antifuses into which writing is intended, thereby preventing unexpected writing into those antifuses from being carried out.

Figure 6:
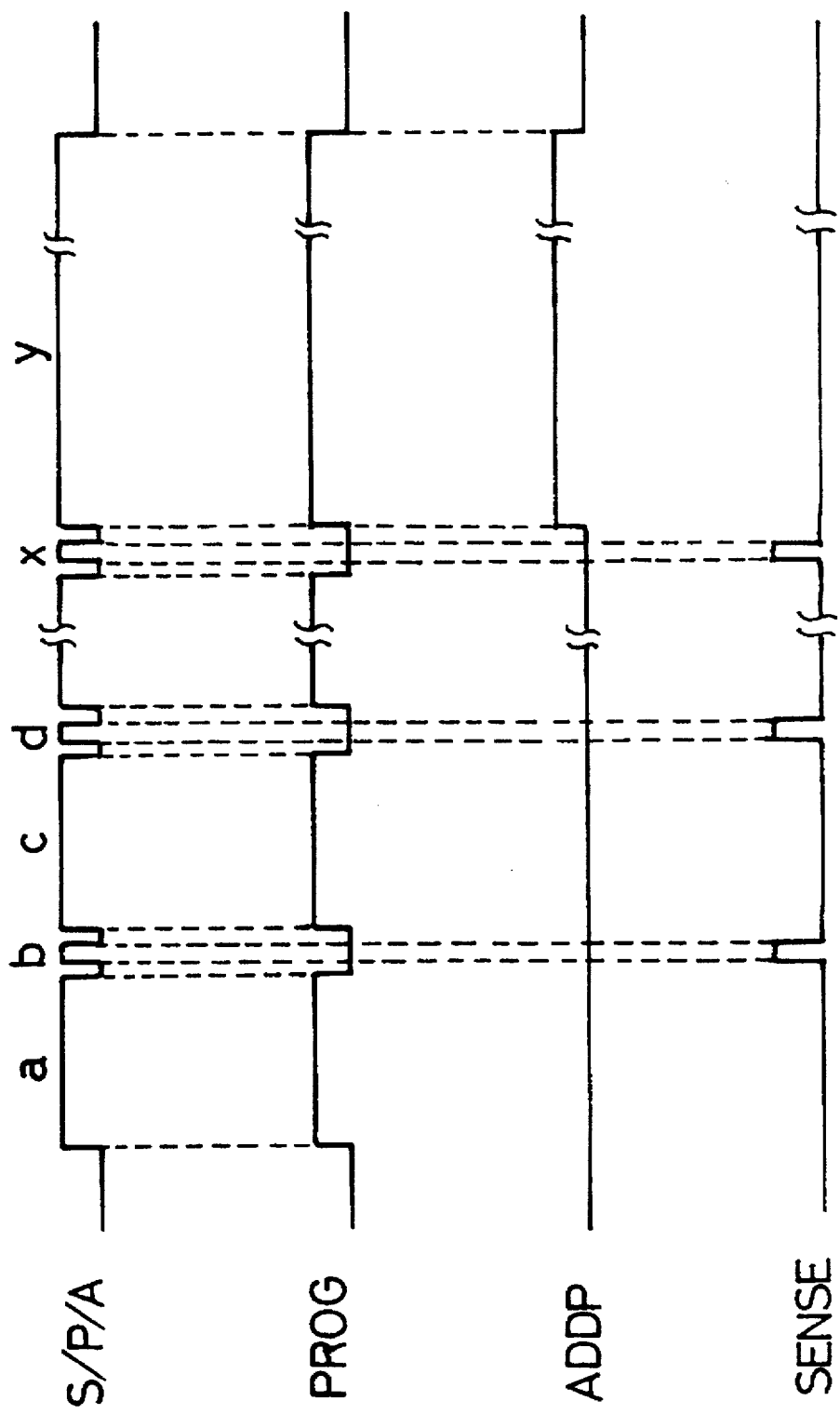
FIG. 6 is a time chart showing a relationship among a S/P/A signal, a PROG signal, an ADDP signal and a SENSE signal when a writing into antifuses is performed.

FIG. 6 is a time chart showing a relationship among the S/P/A signal, the PROG signal, the ADDP signal and the SENSE signal when a writing into antifuses is performed.

First, signals are outputted from the column decoder 50_1 and the row decoder 60_1 in such a manner that one of m pieces of the PMOS transistors 34_1_1, 34_1_2, ..., 34_1_m and one of n pieces of the NMOS transistors 35_1_1, 35_1_2, ..., 35_1_n turn on, so that the antifuse 31 at the their crossing point is designated.

Incidentally, when the antifuse 31 at the their crossing point is kept on the turn-off state, at least one of the CSEL__ signal and the RSEL__ signal, which are fed to the column decoder 50__1 and the row decoder 60__1, respectively, is given with an "H" level. In this manner, all of the PMOS transistors 34__1__1, 34__1__2, . . . , 34__1__m or all of the NMOS transistors 35__1__1, 35__1__2, . . . , 35__1__n turn off, so that writing into the antifuse 31 to be designated by the column address CADDR and the row address RADDR is not implemented.

An operation of the antifuse designation is performed in parallel with respect to the respective blocks 600__1, 600__2, . . . , 600__k.

Here, it is assumed that the antifuse 31 on a certain crossing point in the block 600__1 is designated for writing into the antifuse 31.

Next, as shown in FIG. 6, the S/P/A signal and the PROG signal are given with the pulse shaped "H" level (pulse a in FIG. 6). These signals cause writing for the first time to be carried out. Subsequently, the S/P/A signal and the SENSE signal are given with the pulse shaped "H" level (pulse b in FIG. 6). These signals serve to determine as to whether or not the antifuse of interest to be written changes in state to the turn-on state. If the antifuse of interest is still in the turn-off state, again the S/P/A signal and the PROG signal are given with the pulse shaped "H" level (pulse c in FIG. 6), so that rewriting operation is carried out. Next, the S/P/A signal and the SENSE signal are given with the pulse shaped "H" level (pulse d in FIG. 6) to determine as to whether or not the antifuse of interest changes in state to the turn-on state. This routine is repeatedly carried out in case of need. According to the timing of pulse x, when all of the blocks 600__1, 600__2, . . . , 600__k are in the states as indicated by the expected value PDATA, the PASS__signal is given with an "L" level, so that it is detected that the normal writing has been performed. Then, the S/P/A signal, the PROG signal and the ADDP signal are given with the "H" level by the same time interval as the total pulse width of the previous writing pulses a and c, so that the additional writing is performed by the same time as the total of times required for writing. This causes the antifuse subjected to writing to be surely in the turn-on state.

The above-mentioned routine is repeatedly performed while sequentially altering the addresses CADDR and RADDR which are applied to the column decoder 50__1 and the row decoder 60__1, respectively.

Incidentally, from the terminal for supplying the writing power supply voltage $V_{PP}$, the writing power supply voltage $V_{PP}$, for example, 10V, is supplied while the above-mentioned writing is carried out; in a non-writing test mode, which will be described latter, the middle order of voltage (e.g. 6.5V), which does not cause the antifuse in the turn-off state to change in state to the turn-on state, is supplied; and in a usual operation mode, the logic voltage (e.g. 3.3V) of the internal circuit is supplied.

The non-writing test mode implies a mode for implementing a test for detecting the process failure of the antifuses, and specifically, the non-writing test for confirming that even if the above-mentioned middle order of voltage (e.g. 6.5V) is applied to all of the antifuses, all the antifuses are kept on the turn-off state. Such a non-writing test mode is adopted for determination of quality of the goods or products. In this case, "H" level of CALL signal and RALL signal are applied to the column decoder 50__1 and the row decoder 60__1, respectively, so that all of the PMOS transistors 34__1__1, 34__1__2, . . . , 34__1__m or all of the NMOS transistors 35__1__1, 35__1__2, . . . , 35__1__n are turned on. However, different from the case of the precharge, the PROG signal is kept on the "L" level, and in addition, the side in which the NMOS transistors 35__1__1, 35__1__2, . . . , 35__1__n are connected on a common basis to the ground $V_{SS}$. In this condition, the writing current is supplied, while the writing power supply voltage $V_{PP}$ is the middle order of voltage (e.g. 6.5V). When all the antifuses are kept on the turn-off state, the middle order of voltage appears on the constant-current supply line 36. When there occurs such a failure that anyone of the antifuses becomes the turn-on state, a remarkably lower voltage than the middle order of voltage appears on the constant-current supply line 36. The presence or absence of the failure antifuses can be detected by sensing through setting the expected value PDATA with an "H" level and the SENSE signal with an "H" level.

Next, there will be explained the modification of the second embodiment as mentioned above.

First, with respect to the reference current generating circuit 400, according to the second embodiment, in the writing mode, the sense mode and the additional writing mode, the mutually different reference currents $I_{SN}$ are produced. However, it is acceptable to modify the reference current generating circuit 400 in such a manner that in the additional writing mode the current value is selected to be the same as that in the writing mode, and the pulse width is extended thereby performing the additional writing. Specifically, the current value is given with, for example, 10 mA rather than 20 mA, and instead the pulse width for the additional writing is extended twice. In this case, it is possible to omit the resister 404 and the NMOS transistors 407 shown in FIG. 4.

Further, it is acceptable that the reference current in the writing mode and the reference current in the sense mode are the same as each other. In this case, it is possible to omit the resister 403 and the NMOS transistor 406. Distinction between the writing mode and the sense mode is made, according as the voltage clamp is effected through providing an "H" level for the sense signal (sense mode), and depending on the pulse width.

Figure 7:
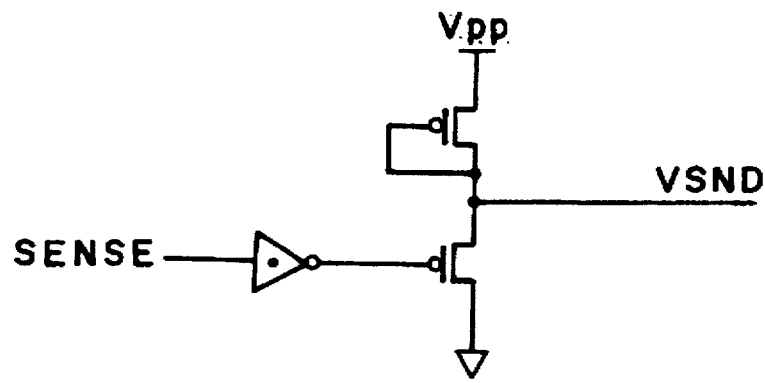
FIG. 7 is a circuit diagram of a comparison voltage generating circuit by way of example in modification.

With respect to the comparison voltage generating circuit 500, it is acceptable to replace the resisters 501 and 502 with FETs. In this case, it is possible to unify the resister 502 and the NMOS transistor 503. FIG. 7 is a circuit diagram of a comparison voltage generating circuit for generating the comparison voltage VSND, which circuit is arranged in the manner as mentioned above.

Figure 8:
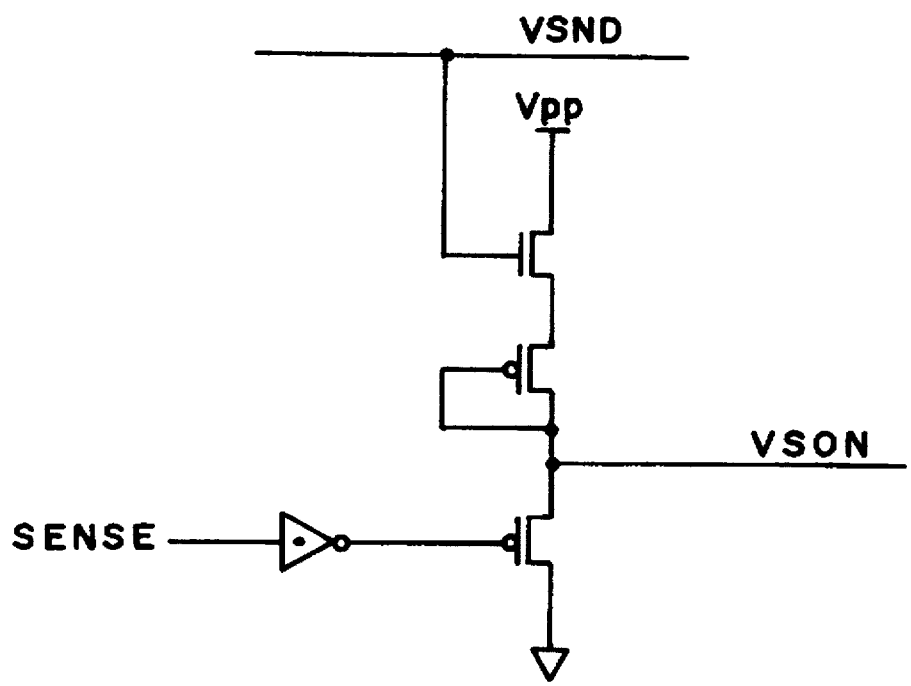
FIG. 8 is a circuit diagram of a comparison voltage generating circuit by way of example in modification.

Likely, it is acceptable to replace the resisters 506 and 507 with FETs. In this case, it is possible to unify the resister 507 and the NMOS transistor 508. FIG. 8 is a circuit diagram of a comparison voltage generating circuit for generating the comparison voltage VSON, which circuit is arranged in the manner as mentioned above.

Figure 9:
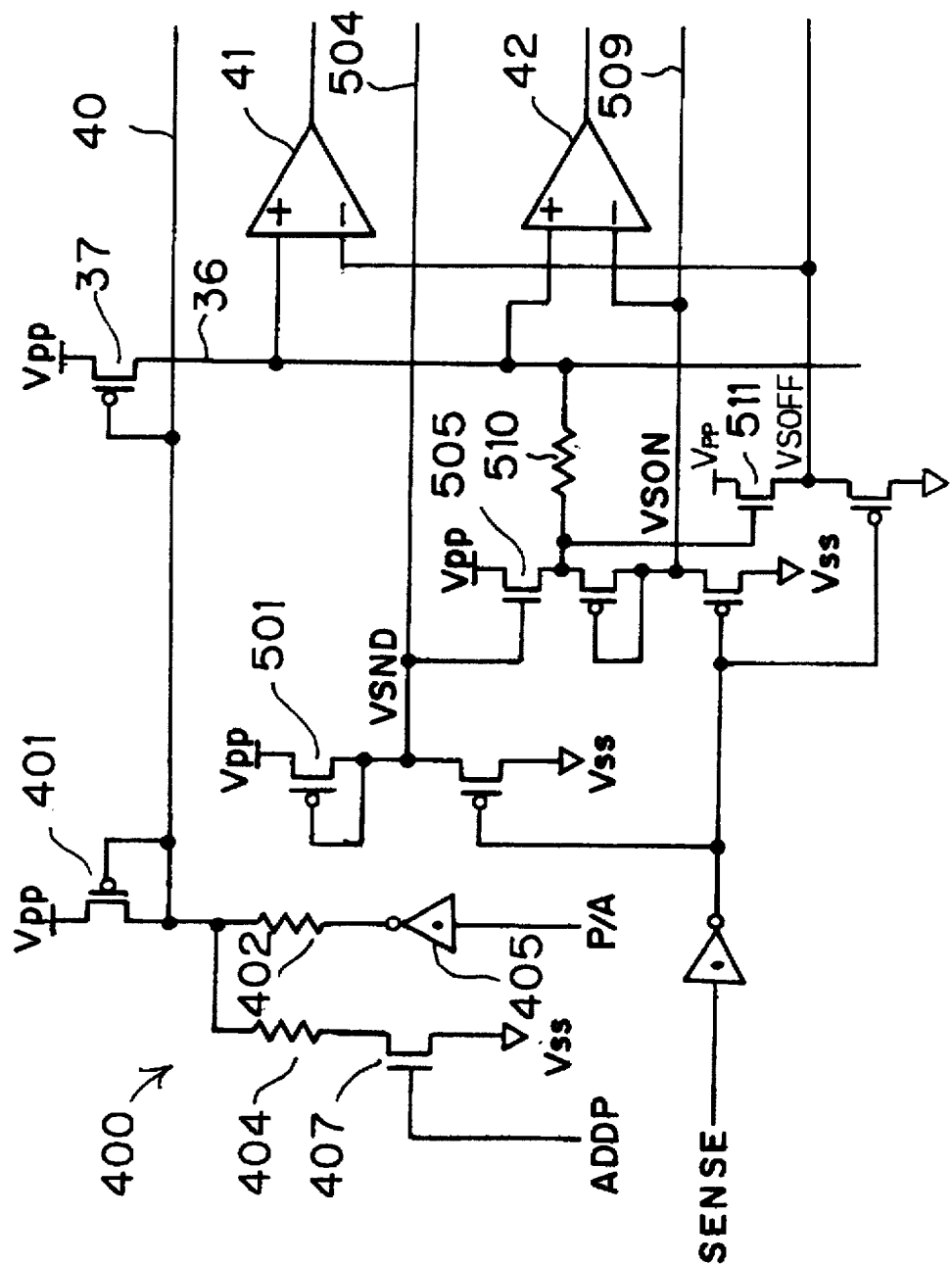
FIG. 9 is a circuit diagram of a sense current generating circuit by way of example in modification.

According to the circuit shown in FIG. 4, the reference current at the time of the sense mode is generated in the reference current generating circuit 400 by means of providing the S/P/A signal having an "H" level, so that the same level of current is generated in the current mirror circuit. However, it is acceptable that as shown in FIG. 9, a sense current is supplied from the comparison voltage VSND via the NMOS transistor 505 and the resister 510 to the constant-current supply line 36. In this case, in a case where the antifuses are in the turn-off state, there appears a voltage which is lower by the corresponding threshold voltage $V_{TN}$ of the NMOS transistor 505 than the comparison voltage VSND, and thus there is no need to provide the clamp circuit with the PMOS transistor 43 as shown in FIG. 4. However, in this case, a voltage VSOFF, which is lower by the corresponding threshold voltage $V_{TN}$ of the NMOS transistor 511 than the resultant voltage, is supplied to the comparator 41 as a comparison voltage.

Figure 10:
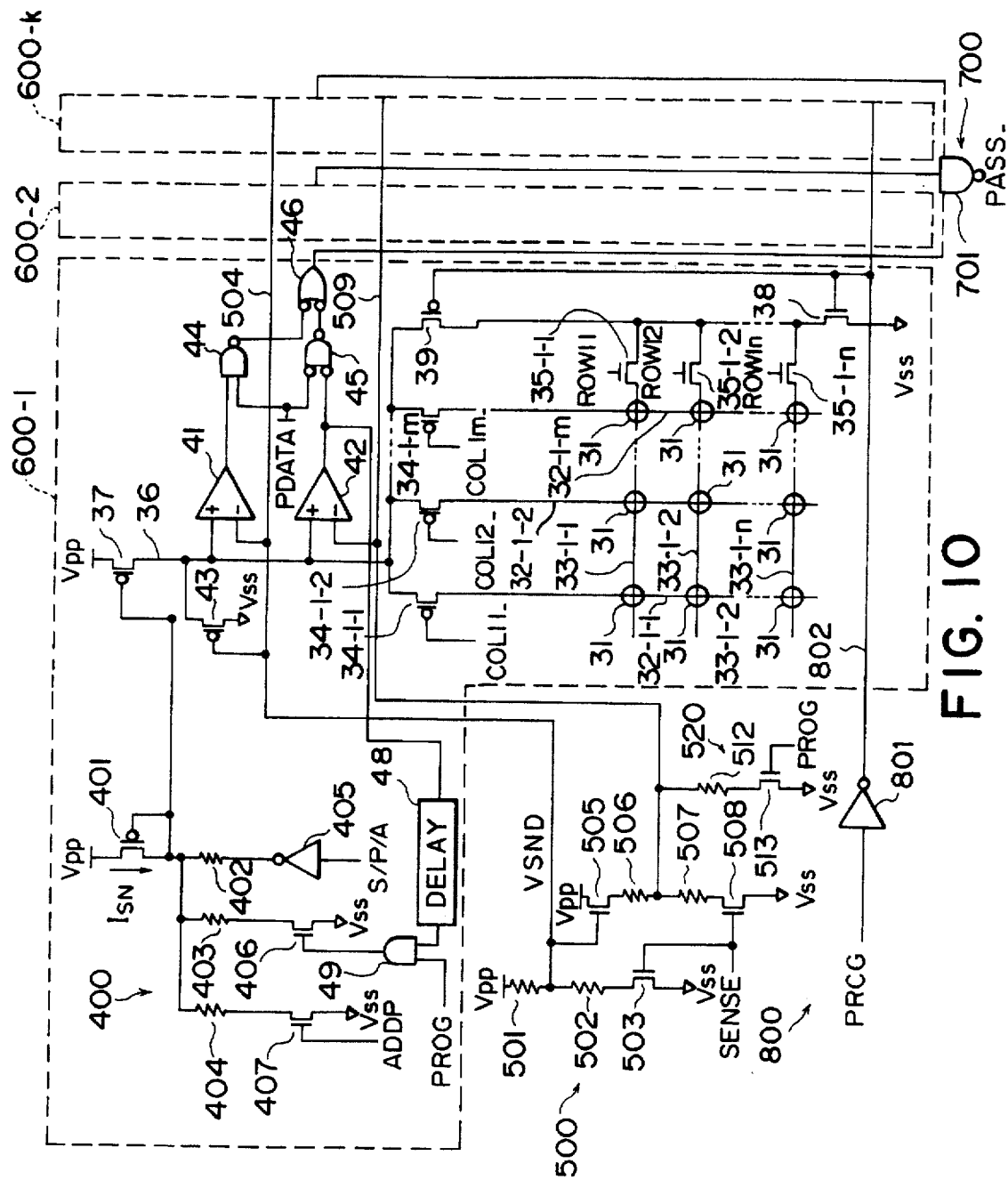
FIG. 10 is a circuit diagram of a writing circuit portion into antifuses of a semiconductor device according to the third embodiment of the present invention.

FIG. 10 is a circuit diagram of a writing circuit portion into antifuses of a semiconductor device according to the third embodiment of the present invention. In FIG. 10, the same parts are denoted by the same reference numbers as those of FIG. 4. And the redundant explanation will be omitted.

According to the circuit shown in FIG. 10, as compared with the circuit shown in FIG. 4, the comparison voltage generating circuit 500 is provided with a breakdown detecting comparison voltage generating circuit 520. Further, there are added a delay circuit 48 connected to an output of the comparator 42, and an AND gate 49 of which inputs receive an output signal of the comparator 42 and the program signal PROG, and of which an output is connected to the gate of the NMOS transistor 406.

The reference current generating circuit 400 is provided for each of the blocks 600_1, 600_2, ..., 600_k.

The breakdown detecting comparison voltage generating circuit 520 is a circuit for generating a comparison voltage to detect whether the antifuse 31 occurs a breakdown in the writing mode, wherein a resister 512 and an NMOS transistor 513 are connected in series between the second comparison signal line 509 and the ground $V_{SS}$. A gate of the NMOS transistor 513 receives the program signal PROG.

In the writing mode, the program signal PROG appears in an "H" level and the sense signal SENSE appears in an "L" level. Consequently, there appears on the second comparison signal line 509 the breakdown detecting comparison voltage derived through potential dividing by the resisters 506 and 512 of a voltage which is lower by the corresponding threshold voltage $V_{TN}$ of the NMOS transistor 505 than the writing power supply voltage $V_{PP}$. Such a breakdown detecting comparison voltage is fed to the comparator 42. In the writing mode, before the breakdown occurs on the antifuse 31, the writing power supply voltage $V_{PP}$ appears on the constant-current supply line 36. Therefore, the comparator outputs an "H" level of signal. When the breakdown occurs on the antifuse 31, a lower voltage than the breakdown detecting comparison voltage appears on the constant-current supply line 36. As a result, the output of the comparator 42 reverses in the level to the "L" level. This "L" level of signal is delayed by, for example, 2µ sec, through the delay circuit 48 and transferred to one of the inputs of the AND gate 49. At that time, an "H" level of program signal PROG is shut out, so that the NMOS transistor 406 turns off thereby shutting out the current flowing through the resister 403. In other words, at that time, the writing current is restricted to only the current which flows through the resister 402.

According to the embodiment shown in FIG. 10, in a similar fashion to that of the embodiment shown in FIG. 1, even if the respective antifuses 31 are mutually different in time up to the breakdown, writing is performed according to the different breakdown time. Thus, it is possible to more uniform and stable resistance value of filaments.

As explained above, according to the present invention, it is possible to form stable filaments which are small in resistance value and less in disunity, and also possible to implement high speed operations of the PLD and the PROM. Further, according to the present invention, it is possible to produce high reliable chips, since it hardly involves malfunction because the timing skew of the PLD and the PROM is less, and further it involves no switch off in mid course of the operation.

Furthermore, according to the present invention, there is provided a programmable semiconductor device, having a constant-voltage power supply terminal for writing, capable of easily writing with a technique similar to that of writing into, for example, the usual RAM and the like.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

We claim:

1. A semiconductor device comprising:

a first signal line;

a second signal line intersecting the first signal line at an intersection point;

an antifuse located at the intersection point of the first signal line and the second signal line and having a resistance;

a constant-current circuit that applies a variable voltage to the antifuse, said constant-current circuit varying said variable voltage in accordance with a value of the resistance of the antifuse to supply a constant current to the antifuse, said variable voltage remaining less than a predetermined voltage as it is varied by said constant-current circuit; and a detecting circuit that detects when a current starts to flow through the antifuse;

wherein said constant-current circuit supplies a predetermined first constant current to the antifuse until a predetermined time after said detecting circuit detects the current flowing through the antifuse elapses, and, after the predetermined time elapses, stops supplying the predetermined first constant current to the antifuse.

2. A semiconductor device comprising:

a first signal line;

a second signal line intersecting the first signal line at an intersection point;

an antifuse located at the intersection point of the first signal line and the second signal line and having a resistance;

a constant-current circuit that applies a variable voltage to the antifuse, said constant-current circuit varying said variable voltage in accordance with a value of the resistance of the antifuse to supply a constant current to the antifuse, said variable voltage remaining less than a predetermined voltage as it is varied by said constant-current circuit; and a detecting circuit that detects when a current starts to flow through the antifuse;

wherein said constant-current circuit supplies a predetermined first constant current to the antifuse until a predetermined time after said detecting circuit detects the current flowing through the antifuse elapses, and, after the predetermined time elapses, supplies a second constant current to the antifuse, the second constant current being less than the predetermined first constant current.

3. A semiconductor device according to claim 1, wherein said detecting circuit is a comparator that compares one of a voltage appearing on one end of the antifuse and a voltage associated with the voltage on the one end of the antifuse to a predetermined reference voltage.

4. A semiconductor device comprising:

a first signal line;

a second signal line intersecting the first signal line at an intersection point;

an antifuse located at the intersection point of the first signal line and the second signal line; and a constant-current circuit selectively operative in one of at least:

a writing mode in which the constant-current circuit supplies a writing current to the antifuse that changes a state of the antifuse from a non-conductive state to a conductive state, a sense mode in which the constant-current circuit supplies a sensing current to the antifuse to detect the state of the antifuse, and an additional writing mode in which the constant-current circuit supplies an additional writing current to the antifuse to perform writing of the state of the antifuse.

5. A semiconductor device according to claim 4, wherein said constant-current circuit has a voltage clamp circuit that, when said constant-current circuit is in the sense mode, limits a voltage applied to the antifuse when the antifuse is in the non-conductive state such that the antifuse is kept in the non-conductive state.

6. A semiconductor device according to claim 4, wherein said semiconductor device further comprises a state detection circuit that detects the state of the antifuse on the basis of a voltage which appears when the sensing current is supplied to the antifuse.

7. A semiconductor device comprising:

a plurality of first signal lines mutually extending in parallel;

a plurality of second signal lines mutually extending in parallel, the plurality of second signal lines intersecting the plurality of first signal lines at a plurality of intersection points, where one second signal line intersects one first signal line at one intersection point; and a plurality of antifuses, each antifuse located at one of the intersection points of the plurality of first signal lines and the plurality of second signal lines;

a plurality of first switching circuits, each first switching circuit connected in series to one of said plurality of first signal lines;

a plurality of second switching circuits, each second switching circuit connected in series to one of said plurality of second signal lines;

a first decoder that optionally selects desired ones of said plurality of first signal lines through control of said plurality of first switching circuits;

a second decoder that optionally selects desired ones of said plurality of second signal lines through control of said plurality of second switching circuits; and a constant-current circuit that supplies constant currents, the constant currents controlled independently of each other on a parallel basis and supplied to at least one of the plurality of antifuses which are simultaneously selected for writing in accordance with the desired ones of said first and second signal lines selected by said first decoder and said second decoder.

8. A semiconductor device according to claim 7, wherein said first decoder and said second decoder each have modes for simultaneously selecting all of the first signal lines and all of the second signal lines, respectively.

9. A semiconductor device according to claim 4, wherein said constant-current circuit has:

a reference current generating circuit that generates a reference current; and a constant-current supplying circuit that generates, using a current mirror circuit, a constant current according to the reference current generated by said reference current generating circuit and that supplies the constant current to the antifuse.

10. A semiconductor device according to claim 4, further comprising a detecting circuit that detects when a current starts to flow through the antifuse when said constant-current circuit is in the writing mode, wherein, when said constant-current circuit is in the writing mode, said constant-current circuit supplies a predetermined first constant current until a predetermined time after said detecting circuit detects the current flowing through the antifuse, and, after the predetermined time elapses, stops supplying the predetermined first constant current to the antifuse.

11. A semiconductor device according to claim 4, further comprising a detecting circuit that detects when a current starts to flow through the antifuse when said constant-current circuit is in the writing mode, and wherein, when said constant-current circuit is in the writing mode, said constant-current circuit supplies a predetermined first constant current until a predetermined time after said detecting circuit detects the current flowing through the antifuse elapses, and, after the predetermined time elapses, supplies a second constant current to the antifuse, the second constant current being less than the predetermined first constant current.

12. A semiconductor device according to claim 2, wherein said detecting circuit is a comparator that compares one of a voltage appearing on one end of the antifuse and a voltage associated with the voltage on the one end of the antifuse to a predetermined reference voltage.

* * * * *